United States Patent
Zeyen (10) Patent No.: US 9,533,877 B2
(45) Date of Patent: Jan. 3, 2017

(54) ANODIC BONDING OF DIELECTRIC SUBSTRATES

(71) Applicant: Innovative Micro Technology, Goleta, CA (US)

(72) Inventor: Benedikt Zeyen, Santa Barbara, CA (US)

(73) Assignee: Innovative Micro Technology, Goleta, CA (US)

( * ) Notice: Subject to any disclaimer, the term of this patent is extended or adjusted under 35 U.S.C. 154(b) by 0 days.

(21) Appl. No.: 15/098,353

(22) Filed: Apr. 14, 2016

(65) Prior Publication Data

US 2016/0304335 A1    Oct. 20, 2016

Related U.S. Application Data

(60) Provisional application No. 62/148,897, filed on Apr. 17, 2015.

(51) Int. Cl.
  *H01L 33/18*    (2010.01)
  *B81B 7/00*     (2006.01)
  *B81C 1/00*     (2006.01)

(52) U.S. Cl.
  CPC ......... *B81B 7/0067* (2013.01); *B81C 1/00317* (2013.01); *B81B 2201/0264* (2013.01); *B81B 2201/047* (2013.01); *B81B 2207/115* (2013.01); *B81C 2201/013* (2013.01); *B81C 2203/031* (2013.01)

(58) Field of Classification Search
  None
  See application file for complete search history.

(56) References Cited

U.S. PATENT DOCUMENTS

| | | | | |
|---|---|---|---|---|
| 4,333,847 A | * | 6/1982 | Tran | C03C 1/002 210/682 |
| 6,150,032 A | * | 11/2000 | Yang | C09D 5/08 252/500 |
| 2003/0224559 A1 | * | 12/2003 | Gross | H01L 21/2007 438/128 |
| 2005/0212111 A1 | * | 9/2005 | Terazaki | B81C 1/00119 257/686 |
| 2005/0256224 A1 | * | 11/2005 | Miyata | C09C 1/3684 523/160 |
| 2006/0198021 A1 | * | 9/2006 | Fukuda | G02B 1/11 359/487.05 |
| 2007/0146887 A1 | * | 6/2007 | Ikeda | G02B 1/111 359/586 |
| 2008/0266661 A1 | * | 10/2008 | Nakamura | G02B 5/3041 359/485.01 |
| 2009/0267270 A1 | * | 10/2009 | Murakami | B29C 35/0888 264/447 |
| 2009/0290469 A1 | * | 11/2009 | Watanabe | C09B 23/04 369/100 |

(Continued)

*Primary Examiner* — Michael Lebentritt
(74) *Attorney, Agent, or Firm* — Jaquelin K. Spong (57) ABSTRACT

A first ion rich dielectric substrate with a patterned dielectric barrier and a oxidizable metal layer is anodically bonded to a second ion rich dielectric substrate. To bond the substrates, the oxidizable metal layer is oxidized. The dielectric barrier may inhibit the migration of these ions to the bondline, which might otherwise poison the bond strength. Accordingly, when joining the two substrates, a strong bond is maintained between the wafers.

19 Claims, 7 Drawing Sheets

(56) References Cited

U.S. PATENT DOCUMENTS

2011/0171789 A1* 7/2011 Korgel .............. H01L 29/42332
                                                        438/151
2012/0313199 A1* 12/2012 Orita ........................ C08K 3/22
                                                        257/431

* cited by examiner

ANODIC BONDING OF DIELECTRIC SUBSTRATES

CROSS REFERENCE TO RELATED APPLICATIONS

Not applicable.

STATEMENT REGARDING FEDERALLY SPONSORED RESEARCH Not applicable.

STATEMENT REGARDING MICROFICHE APPENDIX Not applicable.

BACKGROUND

This invention relates to a methodology for bonding together two microfabrication substrates.

Microelectromechanical systems are devices which are manufactured using lithographic fabrication processes originally developed for producing semiconductor electronic devices. Because the manufacturing processes are lithographic, MEMS devices may be made in very small sizes. MEMS techniques have been used to manufacture a wide variety of transducers and actuators, such as accelerometers and electrostatic cantilevers.

MEMS devices are often movable, they may be enclosed in a rigid structure, or device cavity formed between two substrates, so that their small, delicate structures are protected from shock, vibration, contamination or atmospheric conditions. Many such devices also require an evacuated environment for proper functioning, so that these device cavities may need to be hermetically sealed after evacuation. Thus, the device cavity may be formed between two substrates which are bonded using a hermetic adhesive.

Many devices require a transmissive material for the device substrate and/or the lid substrate, in order for the produced, emitted or altered electromagnetic radiation to be transmitted to or from the device cavity. Infrared emitters, detectors, attenuators, grating and mirrors for example, require encapsulation in infrared transmissive materials. Glass is a popular substrate material, however, glass is generally an insulating material. As a result, anodic bonding between two glass substrates is not possible, because the voltage cannot be applied to the insulating material properly. Also, it is often desired for the bonding material to be conductive, so as to provide an electrical pathway between structures on either substrate. Therefore a need exists for a packaging technology which can bond two optically transparent substrates with a conductive bond.

Anodic bonding of a glass substrate to a silicon substrate is known, wherein voltage and heat are applied between the glass substrate and the silicon substrate. The voltage applied promotes electrostatic attraction and the growth of an oxide layer between the silicon and the glass, which adheres the materials together. However, this method requires one of the substrates be a silicon or metal substrate, which, of course, is not transmissive to most portions of the electromagnetic spectrum, including the visible portion.

Accordingly, encapsulation of an optical device in a transparent device cavity which is hermetically sealed has been an unresolved problem.

SUMMARY

The systems and methods described here provide an electrically conductive, anodic bond between two optically transparent substrates. The method uses ion-rich, nominally conductive optically transparent substrates. Borosilicate substrates such as Borofloat® or Pyrex® glass substrates are appropriate for this method. A first ion rich dielectric substrate may have a patterned dielectric barrier deposited thereon, and a patterned or unpatterned oxidizable metal layer over the dielectric barrier. The first substrate is then anodically bonded to a second ion rich dielectric substrate. During the anodic bonding process, the oxygen from anions from the second substrate migrates towards the bondline and forms a metal oxide with the oxidizable metal layer of the first substrate, thus joining the two substrate while releasing electrons into the metal. The dielectric barrier may inhibit the migration of cations (here, sodium cations $Na^+$) to the metal bondline, which would otherwise weaken the bond, as explained further below.

Borosilicate substrates will generate sodium and oxygen as free ions when heated and in a strong electric field. Titanium may be used as the oxidizable metal. Silicon nitride may be used as the dielectric barrier. The first substrate is taken, and deposited with a silicon nitride patterned in the general shape of the bondline, using, e.g. PECVD to form a dielectric barrier. The substrate may be etched, or a pattern and liftoff procedure may be used (deposit and etch) to form a titanium bondline over the silicon nitride barrier. The substrate may be either blanketed uniformly all over, or patterned over the silicon nitride barrier around the bondline. Finally, the first borosilicate substrate may be anodically bonded to a second borosilicate substrate.

Accordingly, the method may include providing a first and a second ion rich dielectric substrate, forming a patterned dielectric barrier on at least one of the first and the second ion rich dielectric substrates, forming a layer of an oxidizable metal over the dielectric barrier, anodically bonding the first to the second ion rich dielectric substrate at the dielectric barrier by oxidizing the oxidizable metal layer to form a metal oxide, wherein the dielectric barrier inhibits migration of ions to the oxidizable metal layer, and wherein the metal oxide provides an adhesive force that bonds the substrates together.

Using this approach, a microfabricated device may be fabricated, which includes a first and a second ion rich dielectric substrate, a dielectric barrier that inhibits the flow of ions and is disposed adjacent to at least one of the first and the second substrate, an oxidizable metal layer disposed over the dielectric barrier, and a metal oxide layer formed from the ion rich substrate and the oxidizable metal layer, wherein the metal oxide layer bonds the two ion rich layers together.

These and other features and advantages are described in, or are apparent from, the following detailed description.

BRIEF DESCRIPTION OF THE DRAWINGS

Various exemplary details are described with reference to the following figure, wherein:

FIGS. 2a and 2b are a schematic cross sectional views of an anodic bonding technique using a sacrificial blanket metallization, wherein FIG. 2b depicts the removal of the excess metallization;

It should be understood that the drawings are not necessarily to scale, and that like numbers may refer to like features.

DETAILED DESCRIPTION

This disclosure describes a novel technique anodic for bonding two transparent substrates. Generally, anodic bonding has been performed between two silicon substrates, or a silicon substrate and a glass substrate, by applying a voltage between the substrates and bringing them to a sufficiently high temperature. Of course, this requires at least one of the substrates to be silicon, or nominally conductive, in order to conduct the current away from the bondline.

This disclosure describes an anodic bonding method between two nominally insulating but ion transporting dielectric substrates. As with all anodic bonding, the other bonding material is an oxidizable metal. The method relies on a low, but finite, level of conductivity within the material, to conduct the ions to the voltage terminals. Central to the method is the use of a dielectric barrier under a metal bonding material, that prevents some positively charged ions from entering the bondline area, in the region near the dielectric barrier.

Throughout this description, the same or similar numerals will refer to the same or similar structures. Accordingly, 100 refers to the first substrate, and 200 refers to a second substrate throughout. 110 refers to a conductive metal layer, and 130 refers to the dielectric barrier. 140 refers to a metal oxide bonding layer, and 120 refers to a sodium rich surface of poor mechanical quality adjacent to the dielectric barrier layer. This disclosure is directed to the application wherein the first substrate 100 and the second substrate 200 are both borosilicate glass, such as Pyrex®. It should be understood that this is exemplary only, and that the method may be applied to any material which is nominally conductive to ions, especially positively charged ions.

It should be understood that the terms "wafer" and "substrate" are used interchangeably to refer to a flat supporting surface on which devices such as MEMS devices and integrated circuits are generally lithographically fabricated. The term "low diffusivity" should be understood to mean a material which is at least an order of magnitude (10×) more resistant to cation flow than a borosilicate material. "Ion-rich" should be understood to mean a material with a current density of on the order of 1 nA/cm$^2$ in an applied external field of about 1 MV/m at bonding temperature.

A first ion rich dielectric substrate with a patterned dielectric barrier and an oxidizable metal layer may be anodically bonded to a second ion rich dielectric substrate. The oxidizable metal layer may be patterned or unpatterned. During the anodic bonding process, the oxygen anions from the second substrate form a metal oxide with the oxidizable metal layer of the first substrate, thus joining the two substrates while releasing electrons into the metal. In areas outside the dielectric barrier, cations (Na$^+$) from the first substrate move towards the same metal line, receiving the electrons from the metal line and form a metallic sodium layer (which can be mechanically weak). Outside the dielectric barrier, the bonding strength may be poor because of the buildup of metallic sodium. However, in the area under the dielectric barrier, the barrier may inhibit the migration of these cations across to the oxidizable metal layer, which would otherwise weaken the bond. The bond strength is thus assured at least over the lateral extent of the dielectric barrier. For properly chosen dimensions, this lateral extent is sufficient to provide a secure, hermetic seal between the two substrates. Accordingly, the dielectric barrier forms a geometry for a bond line and locally prevents cation flux from the metal line (thus keeping the bond mechanically strong), in the area where the barrier is located.

The oxidizable metal layer may extend deeper and wider than the dielectric barrier, so that it can shed excess electrons from the oxidation to the anions of the bottom substrate without forming a (possibly weak) cation rich surface right under the mechanical bond.

The microfabricated device described here may comprise a first and a second ion rich dielectric substrate, a dielectric barrier that inhibits the flow of ions and is disposed adjacent to at least one of the first and the second substrate, an oxidizable metal layer disposed over the dielectric barrier, a metal oxide layer formed from the ion rich substrate and the oxidizable metal layer, wherein the metal oxide layer bonds the two ion rich layers together.

Figure 1:
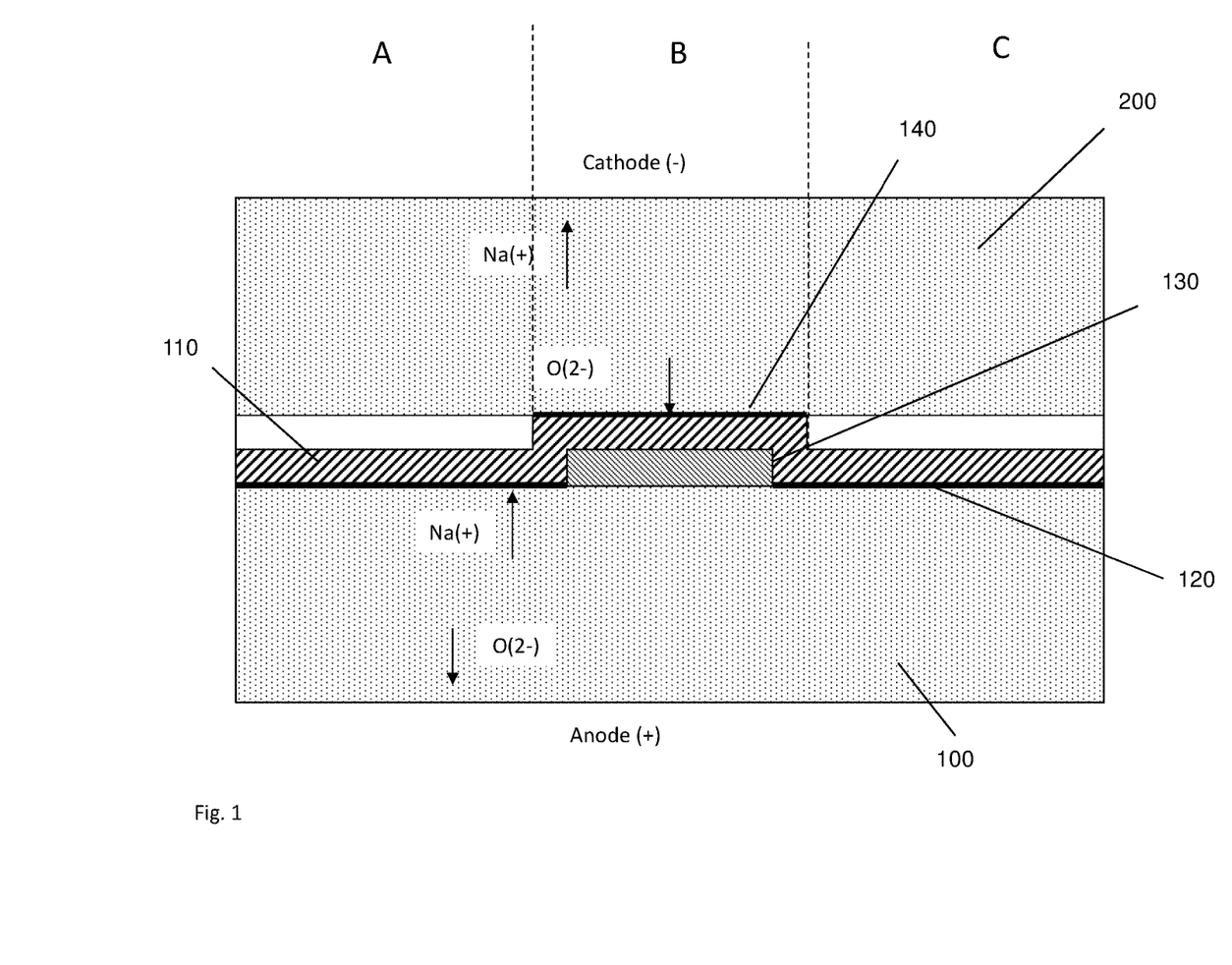
FIG. 1 is a schematic cross sectional diagram of a first embodiment of the anodic bonding technique.

FIG. 1 is a cross-sectional illustration of the novel device. A first substrate 100 maybe a borosilicate glass such as Pyrex. It may be nominally 500 μm thick. In a first step, a dielectric barrier layer 130, is deposited over, adjacent to, or on a top surface the first substrate 100. It should be understood the at the "first" substrate is interchangeable with the "second" substrate, so that the dielectric barrier 130 may be disposed on either the first or the second substrate. The dielectric barrier 130 may be patterned and will define a bondline around a device such as an integrated circuit or a MEMS device. Such a patterned dielectric barrier layer 130 may be formed by a liftoff method, or by deposition followed by etching, for example. The width of the dielectric barrier so formed may be about 100 microns. This dielectric barrier 130 is shown in FIG. 1 in the area "B". This area B performs the primary function of bonding the first substrate 100 to the second substrate 200. In other words, the adhesive force which bonds the two substrates will be created primarily in this area B.

The dielectric material may be for example silicon dioxide, or silicon nitride. It may be for example 2000 Å (200 nm) thick. More generally, the thickness of the dielectric barrier may be about 0.1 to about 5 microns. The thickness required will depend on the application. However, in any case, a thickness should be chosen such that a small or negligible number of sodium cations is able to cross the dielectric barrier at the bonding temperature for the duration of the bonding process. Accordingly, the thickness of the dielectric barrier may be chosen to prevent the flow of ions from the first or the second substrate to the metal layer in the region of the dielectric barrier, at a bonding temperature. More specifically, the dielectric barrier may be formed to a thickness at which only $\frac{1}{100}$ ions is able to cross the dielectric barrier to reach the oxidizable metal at the bonding temperature. The barrier 130 may be patterned using a deposition and etch or a liftoff method, for example. These techniques are well known to those of ordinary skill in the art. The dielectric barrier 130 may also be used as part of a standoff, which defines the minimum separation between the substrates, and thus the clearance for the device cavity.

Over top of this dielectric barrier layer 130 may be deposited a metal layer 110, which covers, conformally, the bondline including the dielectric barrier layer 130. The total width of this metal layer may be, for example, about 300 µm wide, and between 20 to 500 nm thick. As shown in FIG. 1, the oxidizable metal layer 110 may extend well beyond the width of the dielectric barrier 130 in area B. For example, the oxidizable metal 110 may be 300 microns wide. Thus, the oxidizable metal 110 may be three times wider than the dielectric barrier 130, and extend to laterally adjoining areas A-C. More generally, the oxidizable metal may extend laterally beyond the dielectric barrier, and may be at least about one and a half times wider than a width of the dielectric barrier.

The limitation on the width of the metal layer is efficiency of wafer usage and transmissivity. The more area covered by the oxidizable metal 110, the less area available for device usage, and the lower the transmission of light through the structure. Example materials for metal 110 include, for example any oxidizable metals such as aluminum and (Al) and or (titanium). Either of these materials will form a dioxide, such as $Al_2O_3$ or $TiO_2$. Accordingly, the oxidizable metal may be at least one of aluminum (Al) and titanium (Ti), and wherein the dielectric barrier comprises at least one of alumina and titanium dioxide and wherein the first and the second substrates comprise borosilicate.

On top of the metal layer 110, a second substrate 200 may be disposed. The two substrates 100 and 200 may be squeezed together with an adequate amount of pressure, to form a substrate pair, and an adequate voltage applied between the two surfaces. The lower surface of substrate 100 may be against the anode, and the upper surface of wafer 200 may be against the cathode. A voltage may be provided between these two surfaces. The voltage level may be on the order of several hundred volts, for example, about 1 kV. More generally, the method may include pressing the first and second substrates together to form a substrate pair, heating the substrate pair to a bonding temperature of at least about 300 centigrade, applying at least about 750V to the substrate pair.

The substrate pair 100 and 200 along with dielectric barrier layer 130 and metal layer 110, may then then be inserted into a bonding chamber and the temperature raised to for example at least about 300° C.

At temperature, and with the voltage applied, ions from the borosilicate material such as positively charged sodium ($Na^+$) cations, and negatively charged oxygen ($O^{2-}$) anions are created in the applied 1 kV field, and travel to their respective terminals. Positively charged sodium cations will migrate upward toward the anode, and negatively charged oxygen anions will migrate downward toward the cathode. When the sodium ions encounter the metal layer 110, they combine with available electrons to become metallic sodium. Metallic sodium has poor mechanical properties, so if this material is formed in the bondline area, the bond integrity is compromised. Therefore, in all areas where the first substrate 100 is directly in contact with the metal layer 110, the bonding quality is poor. This is shown in areas A and C of FIG. 1. These areas may not contribute substantially to the bonding strength or adhesion of the first substrate with the second substrate. Most of the adhesive force may be provided by area B, in which the dielectric barrier is operative.

Accordingly, when the sodium ions encounter the dielectric barrier layer 130, they are prevented from contacting the metal layer 110. By definition, they cannot or are not conducted across the barrier 130 and stop at the interface to the dielectric barrier layer. Accordingly, the metallic sodium is not formed because free electrons are not available in the dielectric material, by definition.

The sodium ions may migrate some distance laterally into areas A and C, until they encounter the metal layer 110, but this is outside the region of the bondline B. Accordingly, the sodium ions generally do not interfere with the bonding capabilities of the materials within the area B.

For the other polarity, the negatively charged ions, the oxygen ions move downward toward the cathode. The oxygen ions will encounter the metal layer 130 in the vicinity of the dielectric for barrier 130. At that interface, labeled 140, the oxygen ions will form the metal oxide with the oxidizable metal material of the metal layer 110. In the case of titanium, this will be titanium dioxide. In the case of aluminum, this will be aluminum dioxide. In any case, the metal oxide layer 140 forms an effective bond between the second substrate 200, the metal layer 110, and the first substrate 100. In the areas laterally adjacent to the dielectric barrier layer, the bonding strength may be poor, as a result of the buildup of sodium ions in that layer 120.

Accordingly, the primary bond area is the area labeled B in FIG. 1. The areas labeled A and C correspond to areas where the metallic sodium may have built up under the oxidizable metal layer, and therefore the bonding capability is relatively poor. Accordingly, the primary bond strength between the first substrate 100 and the second substrate 200 occurs in area B where the metal oxide 140 occurs. Accordingly, areas A and C do not contribute materially to the bonding between the two substrates 100 and 200, instead the metal oxide layer provides the most bonding strength.

Suitable deposition techniques for the metal layer 110 and dielectric barrier 130 are PECVD, plasma enhanced chemical vapor deposition. As mentioned, the layers may be patterned by etching or lift off methodologies.

Figures 2A, 2B:
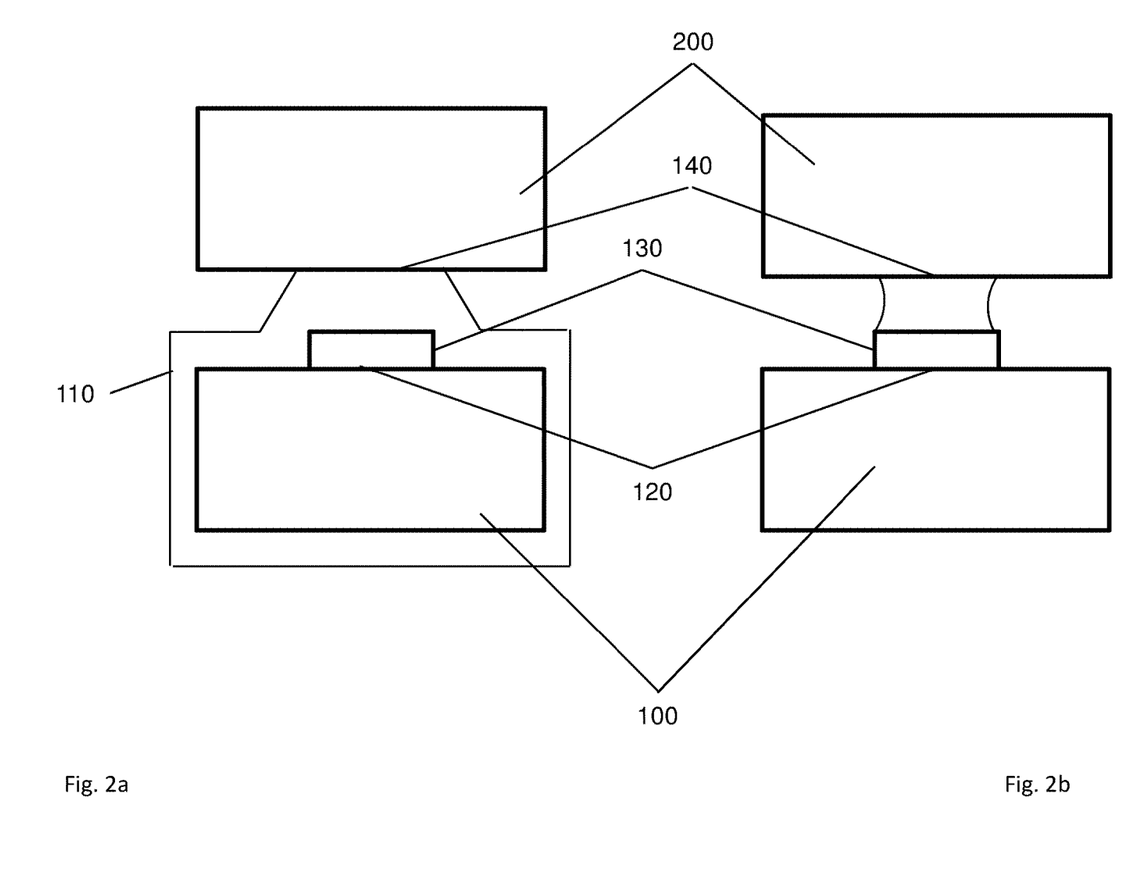

FIG. 2 shows a second embodiment of the novel bonding procedure. As before, 100 refers to the first substrate, 130 refers to a dielectric barrier, and 110 refers to a oxide forming metal layer. 140 refers to the metal oxide bonding layer that is formed between oxidizable metal 110, and a second substrate 200.

As before, the first substrate 100 may have a patterned dielectric barrier 130, formed thereon, for example a silicon dioxide or silicon nitride dielectric barrier layer 130. Substrate 100 and dielectric barrier layer 130 may then be conformally coated with a metal layer 110, so that all surfaces are coated with the metal layer. Accordingly, in FIG. 2A, the metal layer 110 may be unpatterned, and may be disposed over all exposed surfaces of at least one of the first and the second substrate, and over the dielectric barrier. Because the metal layer 110 encloses the entire first substrate 100, the electric field inside the first substrate 100 is zero, and the ions are not driven into the metal layer 110. Accordingly, in FIG. 2A, the poor quality bond layer 120 is not formed because large numbers of sodium ions do not reach the surface of metal layer 110.

Upon exposure to the temperature and voltage, the metal oxide layer 140 may be formed between metal layer 110 and the upper substrate 200. After the metal oxide layer 140 is formed, the excess metal material 110 may be etched away as shown in FIG. 2B. Any suitable etching technique maybe used to remove the metal layer 110, such as plasma etching, acid etching, wet etching or dry etching. In any case, the bond is formed between the upper substrate 200 and the metal layer 110 on the first substrate 100 in the vicinity of the barrier 130. The bonding adhesive character is provided by the metal oxide layer 140 between the surfaces.

Figure 3:
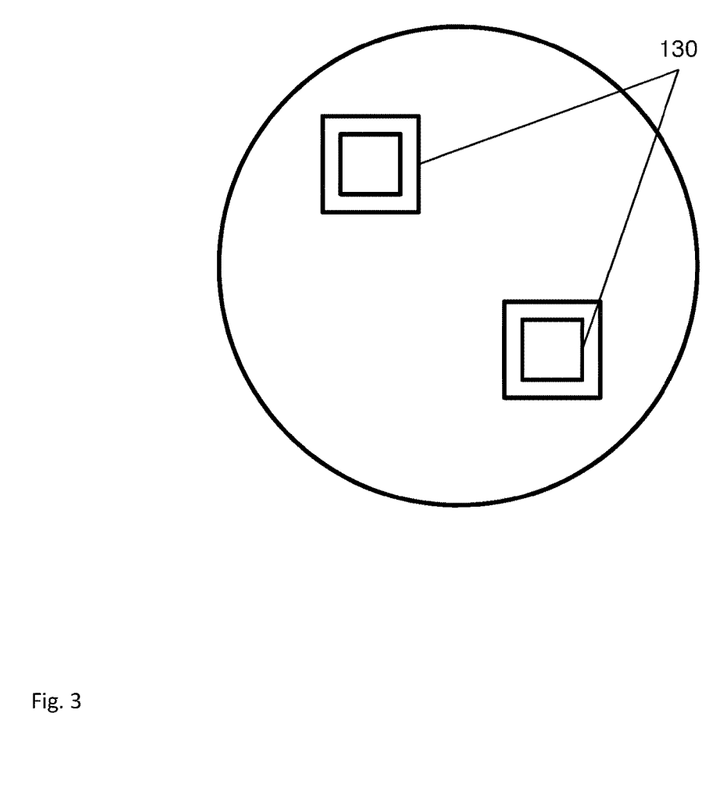
FIG. 3 is a schematic plan view of the anodic bonding technique showing blanket deposited metallization.

FIG. 3 is a plan, schematic view of another embodiment of the present invention. In FIG. 3, on a first substrate 100 a patterned, dielectric barrier layer 130 is formed. As shown in FIG. 3, a plurality of such dielectric barrier layers 130 may be formed, each encircling a device such as a MEMS device or an integrated circuit (IC). For simplicity, the enclosed devices are not shown. Over the dielectric barrier layer 130 may be an unpatterned metal layer. Because the metal layer is not patterned, it has no features and is not shown specifically in FIG. 3. However, it should be understood that the metal layer 110 may cover the entire surface of the first substrate 100 and the dielectric barrier layers 130.

Upon bonding with a second borosilicate substrate (also not shown in the plan view), this metal layer 110 may form the bondline with the second borosilicate substrate 200, as was described previously with respect to FIG. 1. The dielectric barrier layer 130 that was previously formed under the metal layer protects the metal layer from the sodium ions migrating toward the cathode as in FIG. 1. The bonding then proceeds as described above with respect to FIG. 1.

Figure 4:
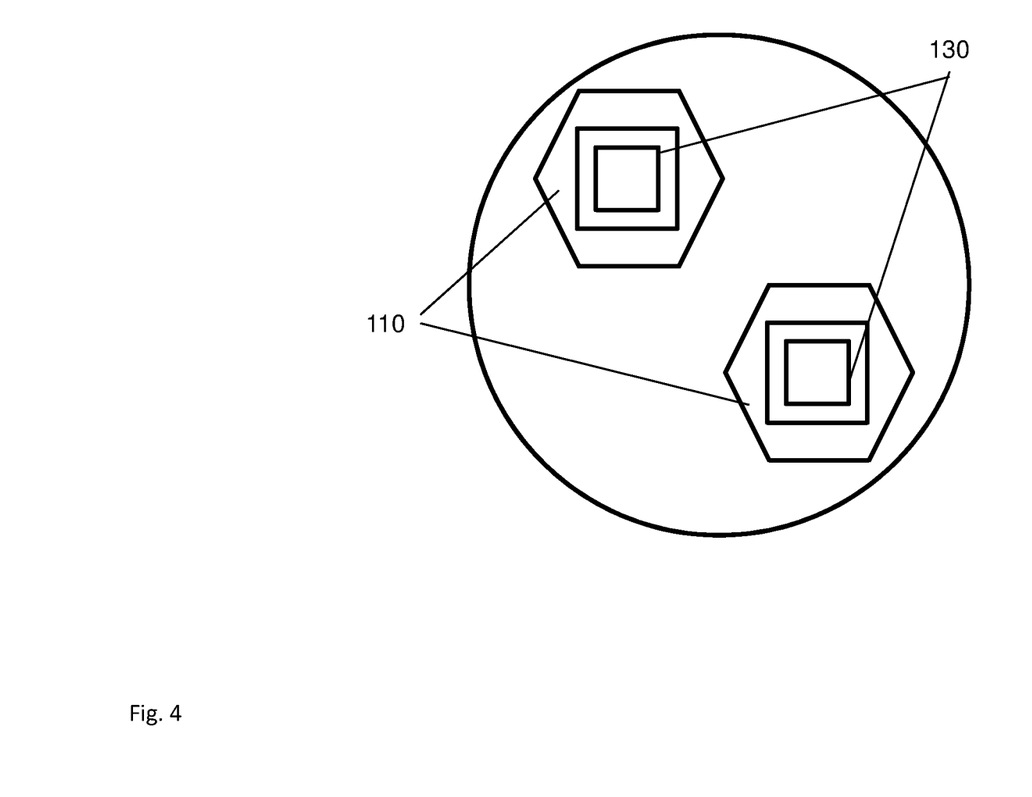
FIG. 4 is a schematic plan view of the anodic bonding technique showing deposited patterned metallization wherein the metal islands are discrete.

In FIG. 4, another embodiment is illustrated in plan view. In FIG. 4, the lower substrate is again deposited and patterned with a dielectric layer 130. As shown in FIG. 4, a plurality of such dielectric barrier layers 130 may be formed, each encircling a device such as a MEMS device or an integrated circuit (IC). Over these dielectric layers 130, a metal layer 110 is formed. However this metal layer may be discrete, forming a plurality of discrete islands over the dielectric barrier layers 130. Once again, the second borosilicate substrate is then laid over top of the first substrate 100. The voltage, pressure and temperature are applied, and the bond forms in the areas of the dielectric barrier layer 130, as was described previously with respect to FIG. 1. Thus, in this embodiment, the oxidizable metal may be disposed in a plurality of discrete islands on a surface of at least one of the first and the second substrate.

It should be understood that and FIGS. 3 and 4, as well as in the other drawings, any number of devices may be placed inside the dielectric barrier layer 130 that defines the bondline. That is, for example, in FIG. 4, integrated circuits or MEMS devices may be fabricated inside the dielectric barrier 130.

Figure 5:
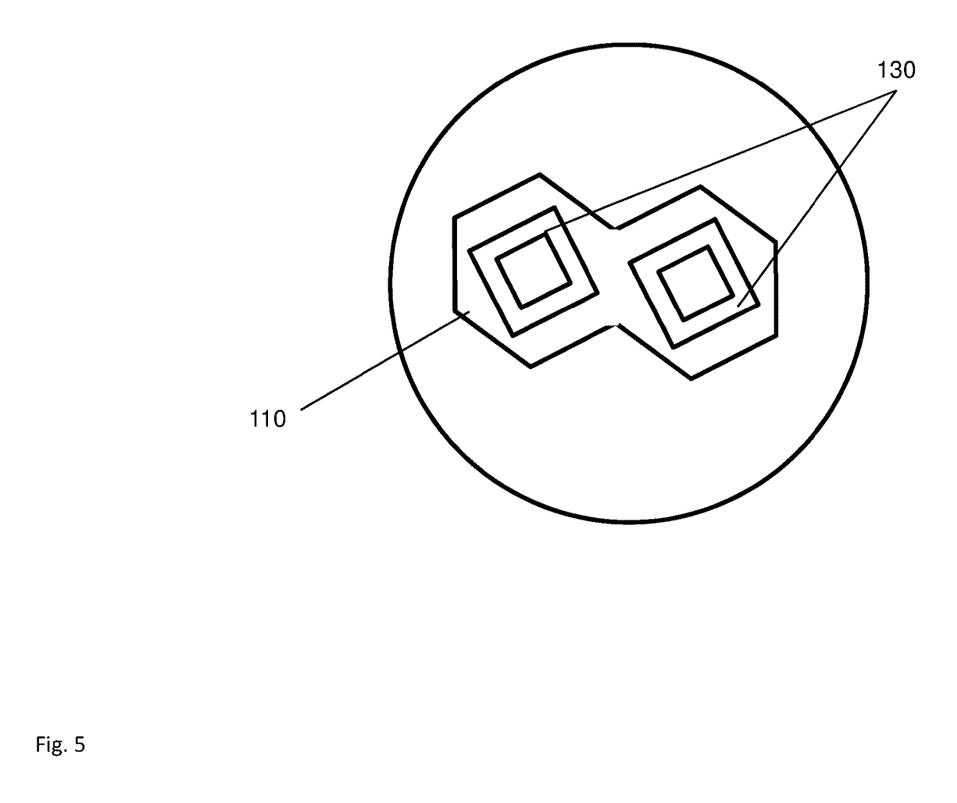
FIG. 5 is a schematic plan view of the anoic bonding technique showing deposited patterned metallization wherein the metal islands are connected by as isthmus.

FIG. 5 shows another embodiment of the novel method. In FIG. 5, first substrate 100 is once again patterned with a dielectric barrier layer 130. As shown in FIG. 5, the dielectric barrier 130 may then be covered with a metal layer 110. However, in contrast to FIG. 4, the metal layers are not discrete but instead are connected at least in an isthmus between the two dielectric barrier layers 130. Bonding of this first substrate 100 with a second borosilicate substrate 200 then proceeds as described above with respect to FIG. 1.

Figure 6:
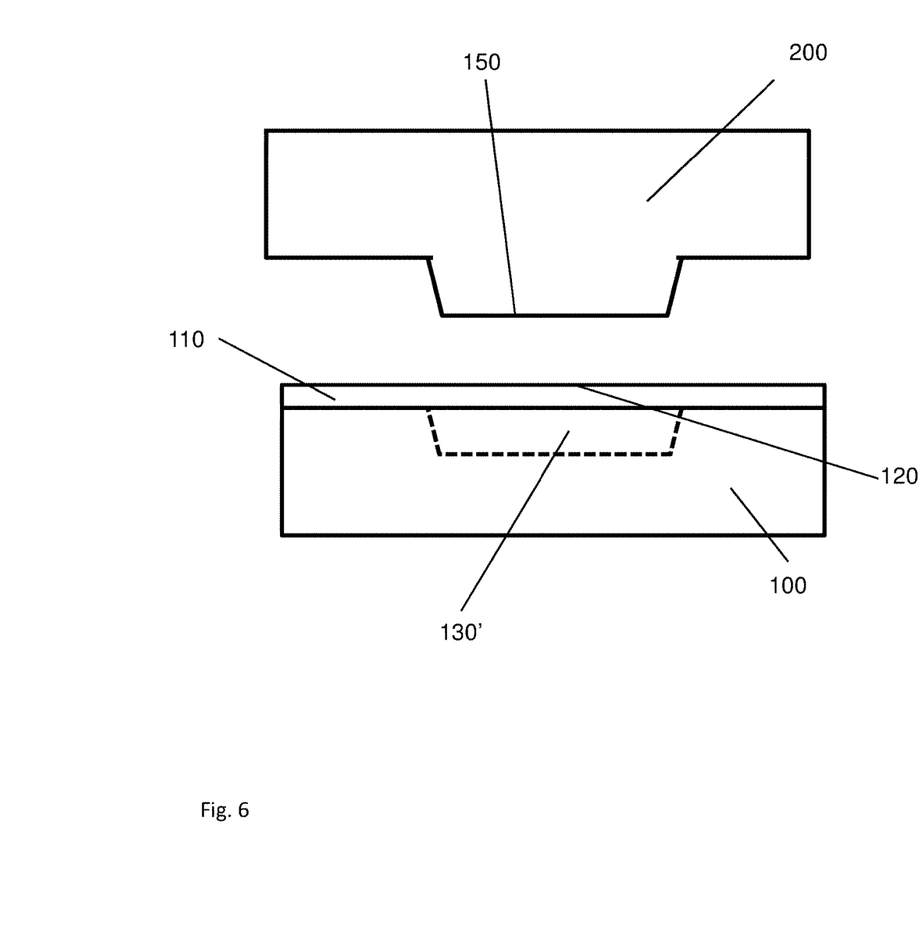
FIG. 6 is a schematic cross sectional diagram of a second embodiment of the anodic bonding technique.

FIG. 6 shows another embodiment of the novel method. In contrast to the previous embodiments, FIG. 6 shows a substrate wherein the lower substrate 100 has been conditioned, pattern or changed in the area shown as 130'. In this area, first substrate 100 has been altered to have the ion conductivity in the area 130' dramatically reduced. The dielectric area 130' may be specifically created by etching, back fill with a dielectric ion barrier, and polish, rendering it a barrier to ion flow. Accordingly, area 130' is a largely insulating, dielectric region within the first substrate 100 (or the second substrate 200). The first substrate 100 is then coated with the metal layer 110, as before. The other substrate 200 is patterned with a standoff 150. The standoff may provide clearance for the devices to be located adjacent to the bond line area 130.

On the second substrate 200, a standoff 150 may be formed. Standoff 150 may create the spacing needed between the first substrate 100 and the second substrate 200. The standoff may comprise the same material as the second substrate, which is a borosilicate glass. The bond will be formed between the standoff 150 and the metal layer 110.

When first substrate 100 is brought together with the second substrate 200 and standoff 150, and a voltage and temperature applied between them, the sodium ions migrate as before to the upper cathode, whereas the oxide anions migrate once again to the anode. Thus, as before, an effective bondline is formed at the layer 140 between the metal layer 110 and the second substrate 200 in the area of the dielectric barrier 130. Accordingly, as shown in FIG. 6, a similar structure results as was shown in FIG. 1. The rest of the bonding process may proceed as before, as was described earlier with respect to FIG. 1.

Figure 7:
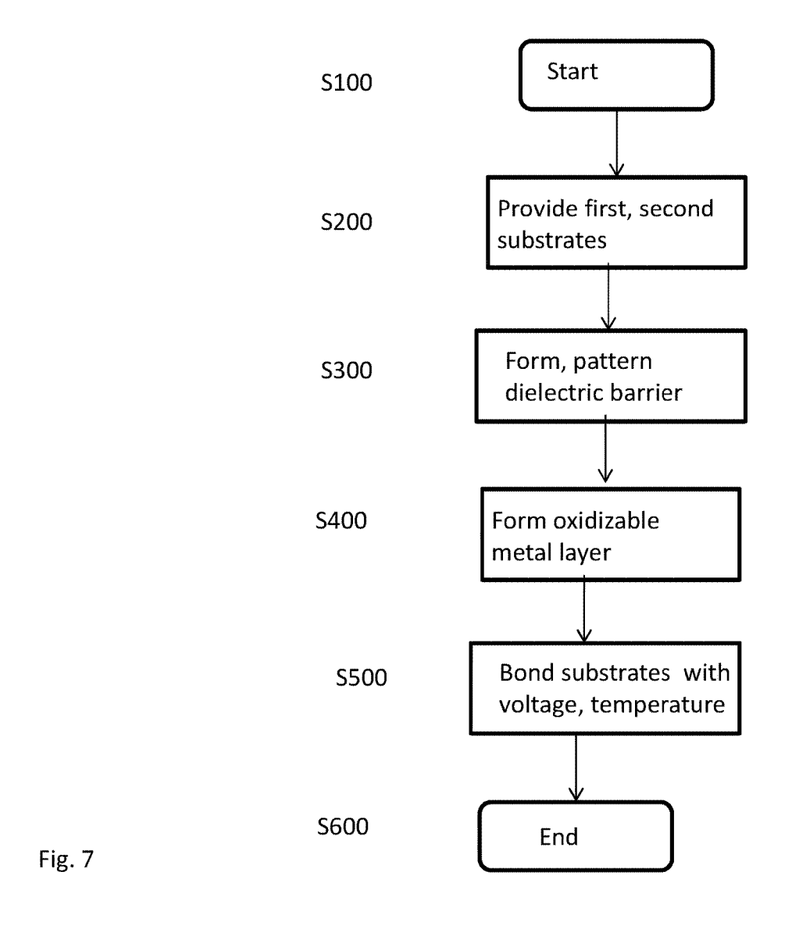
FIG. 7 is an exemplary flowchart illustrating an embodiment of the method.

FIG. 7 is an exemplary flowchart of an embodiment of the method for anodically bonding two nominally insulating borosilicate substrates. The method begins in step S100. In step S200 a first and a second substrate are provided. In step S300, a dielectric barrier is formed. The barrier may be patterned by any of a number of methods, but the barrier generally surrounds other devices formed on the first or the second substrate. In step S400, an oxidizable metal layer is formed over the barrier. In step S500, the first and second substrates are bonded by applying a voltage and temperature to them. The method ends in step S600. It should be understood that this method is exemplary only, and that other steps may be added or deleted.

Advantages of the method as described here may include stronger glass-glass anodic bond by preventing cation buildup under the bond line by virtue of the dielectric action of the patterned dielectric barrier. Thus, the dielectric barrier protects the bondline over some portion of its extent, resulting in a stronger bond over that extent.

While various details have been described in conjunction with the exemplary implementations outlined above, various alternatives, modifications, variations, improvements, and/or substantial equivalents, whether known or that are or may be presently unforeseen, may become apparent upon reviewing the foregoing disclosure. Accordingly, the exemplary implementations set forth above, are intended to be illustrative, not limiting.

What is claimed is:

1. A microfabricated device, comprising:
 a first and a second ion rich dielectric substrate;
 a dielectric barrier that inhibits the flow of ions and is disposed adjacent to at least one of the first and the second substrate;
 an oxidizable metal layer disposed over the dielectric barrier;
 a metal oxide layer formed from the ion rich substrate and the oxidizable metal layer, wherein the metal oxide layer bonds the two ion rich layers together.

2. The microfabricated device of claim 1, wherein a thickness of the dielectric barrier is chosen to prevent the flow of ions from the first or the second substrate to the metal layer in the region of the dielectric barrier, at a bonding temperature.

3. The microfabricated device of claim 2, wherein the thickness of the dielectric barrier is about 0.1 to about 5 microns.

4. The microfabricated device of claim 1, wherein the dielectric barrier comprises at least one of silicon dioxide and silicon nitride.

5. The microfabricated device of claim 1, wherein the dielectric barrier is deposited on a surface of at least one of the first and the second substrate.

6. The microfabricated device of claim 1, wherein the dielectric barrier is formed in a trench on at least one of the first and the second substrate.

7. The microfabricated device of claim 1, wherein the oxidizable metal is at least one of aluminum (Al) and titanium (Ti), and wherein the dielectric barrier comprises at least one of alumina and titanium dioxide and wherein the first and the second substrates comprise borosilicate.

8. The microfabricated device of claim 1, wherein the oxidizable metal is unpatterned, and is disposed over all exposed surfaces of at least one of the first and the second substrate, and over the dielectric barrier.

9. The microfabricated device of claim 1, wherein the oxidizable metal is disposed in a plurality of discrete islands on a surface of at least one of the first and the second substrate.

10. The microfabricated device of claim 1, wherein the oxidizable metal extends laterally beyond the dielectric barrier, and may be about one and a half times wider than a width of the dielectric barrier.

11. A method for bonding two ion rich dielectric substrates, comprising:
provide a first and a second ion rich dielectric substrate;
forming a patterned dielectric barrier on at least one of the first and the second ion rich dielectric substrates;
forming a layer of an oxidizable metal over the dielectric barrier;
anodically bonding the first to the second ion rich dielectric substrate at the dielectric feature by oxidizing the oxidizable metal layer to form a metal oxide, wherein the dielectric barrier inhibits migration of ions to the oxidizable metal layer, and wherein the metal oxide provides an adhesive force that bonds the substrates together.

12. The method of claim 11, wherein forming a patterned dielectric barrier comprises forming a barrier between about 0.1 and about 5 microns in thickness by depositing at least one of silicon dioxide and silicon nitride, and patterning it by at least one of etching and liftoff.

13. The method of claim 11, further comprising:
pressing the first and second substrates together to form a substrate pair;
heating the substrate pair to a bonding temperature of at least about 300 centigrade; and
applying at least about 750V to the substrate pair.

14. The method of claim 11, wherein the first and the second ion rich substrates are both comprise borosilicate.

15. The method of claim 11, wherein forming a patterned dielectric barrier comprises forming a barrier to a thickness at which only $1/100$ ions is able to cross the dielectric barrier to reach the oxidizable metal at the bonding temperature.

16. The method of claim 11, wherein forming a layer of an oxidizable metal comprises forming the layer of oxidizable metal over all exposed surfaces of at least one of the first and the second substrates.

17. The method of claim 13, wherein forming a layer of an oxidizable metal comprises forming the layer of oxidizable metal in a plurality of discrete areas on at least one of the first and the second substrates.

18. The method of claim 11, further comprising:
forming a trench in at least one of the first or the second substrates; and
forming the dielectric barrier in the trench.

19. The method of claim 11, further comprising:
forming the dielectric barrier in an area on at least one of the first and the second substrates, wherein the dielectric barrier also defines a standoff, which determines the minimum separation between the substrates.

* * * * *